(12) United States Patent
Jun et al.

(10) Patent No.: US 9,362,189 B2
(45) Date of Patent: Jun. 7, 2016

(54) CASE INCLUDING SEMICONDUCTOR NANOCRYSTALS, AND OPTOELECTRONIC DEVICE INCLUDING THE SAME

(75) Inventors: Shin Ae Jun, Seongnam-si (KR); Eun Joo Jang, Seoul (KR); In-Taek Han, Suwon-si (KR); Hyun A. Kang, Suwon-si (KR); Hyo Sook Jang, Yongin-si (KR); Sang Eui Lee, Seoul (KR); Soo-Kyung Kwon, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 432 days.

(21) Appl. No.: 13/467,525

(22) Filed: May 9, 2012

(65) Prior Publication Data

US 2013/0062591 A1 Mar. 14, 2013

(30) Foreign Application Priority Data

Sep. 9, 2011 (KR) .................. 10-2011-0092084

(51) Int. Cl.
  *H01L 33/52* (2010.01)
  *H01L 23/08* (2006.01)
  *H01L 33/50* (2010.01)

(52) U.S. Cl.
  CPC .............. *H01L 23/08* (2013.01); *H01L 33/505* (2013.01); *H01L 2224/16145* (2013.01); *H01L 2224/48091* (2013.01); *H01L 2924/12044* (2013.01)

(58) Field of Classification Search
  CPC ...... C09K 11/025; H01L 23/08; H01L 23/02; H01L 23/06; H01L 23/295; H01L 23/298; H01L 23/564; H01L 33/505; H01L 33/564
  USPC .......................................... 313/512
  See application file for complete search history.

(56) References Cited

U.S. PATENT DOCUMENTS

| | | | |
|---|---|---|---|
| 5,766,751 A * | 6/1998 | Kotani et al. ................. 428/323 |
| 6,710,366 B1 * | 3/2004 | Lee et al. ........................ 257/14 |
| 2005/0027081 A1 * | 2/2005 | Okushita et al. .............. 525/419 |
| 2006/0081862 A1 * | 4/2006 | Chua ..................... B82Y 10/00 257/98 |
| 2007/0059705 A1 | 3/2007 | Lu et al. |
| 2008/0121844 A1 * | 5/2008 | Jang et al. ................. 252/301.33 |
| 2009/0133747 A1 * | 5/2009 | Ikeda et al. .................. 136/256 |
| 2010/0116340 A1 * | 5/2010 | Yoneya et al. ................ 136/261 |

(Continued)

FOREIGN PATENT DOCUMENTS

| CN | 101440195 A | 5/2009 |
|---|---|---|
| DE | 1024711 B | 2/1958 |

(Continued)

OTHER PUBLICATIONS

Korean Office Action for Korean Patent Application No. 10-2011-0092084 dated Nov. 14, 2015.

*Primary Examiner* — Nimeshkumar Patel
*Assistant Examiner* — Christopher Raabe
(74) *Attorney, Agent, or Firm* — Cantor Colburn LLP (57) ABSTRACT

A case including a case main body, a matrix including a semiconductor nanocrystal, the matrix disposed in the case main body, and a sealant disposed on the case main body, wherein the sealant has a gas permeability of about 1 cubic centimeter at standard temperature and pressure per centimeter per meter squared per day per atmosphere or less and a tensile strength of about 5 megaPascals or more, and wherein the semiconductor nanocrystal is a Group II-VI compound, a Group III-V compound, a Group IV-VI compound, a Group IV element, a Group IV element, a Group IV compound, or a combination thereof.

23 Claims, 4 Drawing Sheets

(56) References Cited

U.S. PATENT DOCUMENTS

| | | |
|---|---|---|
| 2010/0123155 A1* | 5/2010 | Pickett et al. .................. 257/98 |
| 2010/0247893 A1* | 9/2010 | Zimmerman .............. 428/292.1 |
| 2011/0023932 A1* | 2/2011 | Fukui et al. .................. 136/244 |
| 2011/0177339 A1 | 7/2011 | Lu et al. |
| 2013/0271955 A1* | 10/2013 | Van Bommel et al. ......... 362/84 |
| 2013/0334557 A1* | 12/2013 | Uchida et al. .................. 257/98 |

FOREIGN PATENT DOCUMENTS

| | | | |
|---|---|---|---|
| GB | 783956 A | | 10/1957 |
| JP | 07076607 A | * | 3/1995 |
| JP | 07317905 | | 12/1995 |
| JP | 2004099786 | | 4/2004 |
| JP | 2007-506934 A | | 3/2007 |
| JP | 2007173754 A | | 7/2007 |

* cited by examiner

CASE INCLUDING SEMICONDUCTOR NANOCRYSTALS, AND OPTOELECTRONIC DEVICE INCLUDING THE SAME

CROSS-REFERENCE TO RELATED APPLICATION

This application claims priority to Korean Patent Application No. 10-2011-0092084, filed on Sep. 9, 2011, and all the benefits accruing therefrom under 35 U.S.C. §119, the content of which in its entirety is herein incorporated by reference.

BACKGROUND

1. Field

This disclosure relates to a case including semiconductor nanocrystals, and an optoelectronic device including the same.

2. Description of the Related Art

Semiconductor nanocrystals, which are also called quantum dots, are a semiconductor material with a nano-size and a crystalline structure, and include hundreds to thousands of atoms.

Since the semiconductor nanocrystals are very small, they have a large surface area per unit volume; and also have a quantum confinement effect. Accordingly, they have unique physicochemical properties that differ from the inherent characteristics of a corresponding bulk semiconductor material.

Since optoelectronic properties of nanocrystals may be controlled by selecting their size, the semiconductor nanocrystals are the subject of active research, and are being utilized in display devices and a variety of biotechnology applications.

When semiconductor nanocrystals are used in a display element or the like, a polymer may be used as a matrix resin for dispersing the semiconductor nanocrystals. However, commercially available polymers may not sufficiently protect the semiconductor nanocrystals to provide sufficient storage stability.

BRIEF SUMMARY OF THE INVENTION

An embodiment of this disclosure provides a case for stably closing and sealing a semiconductor nanocrystal from the external environment.

Another embodiment of this disclosure provides a method of manufacturing the case including the semiconductor nanocrystal.

Still another embodiment of this disclosure provides an optoelectronic device including the case.

According to an embodiment of this disclosure, a case includes a case main body, a matrix including a semiconductor nanocrystal, the matrix disposed in the case main body, and a sealant disposed on the case main body, wherein the sealant has gas permeability of about 1 cubic centimeter at standard temperature and pressure per centimeter per meter squared per day per atmosphere ($cm^3$ (STP) $cm/m^2 \cdot day \cdot atm$) or less and a tensile strength of about 5 megaPascals (MPa) or more, and wherein the semiconductor nanocrystal includes a Group II-VI compound, a Group III-V compound, a Group IV-VI compound, a Group IV element, a Group IV compound, or a combination thereof.

The sealant may have a tensile modulus of more than about 0.7 gigaPascals (GPa).

The sealant may be a cured a resin, wherein the resin is an epoxy resin, a thiol-ene resin, or a combination thereof. The epoxy resin may be a polymerization product of a polyhydric phenol or a polyhydric alcohol, and an epihalohydrin. The thiol-ene resin may be a polymer of a first monomer including at least one thiol (—SH) group at a terminal end and a second monomer including at least one carbon-carbon unsaturated bond at a terminal end.

The sealant may include a plate-shaped particle. The plate-shaped particle may be an inorganic oxide, carbon-containing material, a metal-containing material, or a combination thereof. Any plate-shaped particle may be used without limitation. The plate-shaped particle may include a clay, graphene, graphite oxide, a graphite nanoplatelet, a metal flake, or a combination thereof, but is not limited thereto. The plate-shaped particle may be used along with a sphere-shaped or needle-shaped particle.

The clay may include pyrophillite-talc, montmorillonite ("MMT"), fluorine hectorite, kaolinite, vermiculite, illite, mica, brittle mica, or a combination thereof, but is not limited thereto:

The plate-shaped particle may have an aspect ratio of about 1/100,000 to about 1/10. The aspect ratio may be determined by dividing a thickness of the plate-shaped particle by a length of the plate-shaped particle.

The plate-shaped particle may be included in an amount of about 1 to about 100 parts by weight, based on 100 parts by weight of a resin, wherein the resin is an epoxy resin, a thiol-ene resin, or a combination thereof.

According to another embodiment of this disclosure, a method of manufacturing a case is provided including disposing a matrix including a semiconductor nanocrystal in a case main body, and providing a sealant by coating a resin composition including an epoxy resin, a thiol-ene resin, or a combination thereof, and a curing agent on the case main body, and curing the resin composition at a temperature ranging from about 0° C. to about 200° C. to manufacture the case, wherein the sealant has gas permeability of about 1 cubic centimeter at standard temperature and pressure per centimeter per meter squared per day per atmosphere ($cm^3$ (STP)·cm/$m^2 \cdot day \cdot atm$) or less and tensile strength of about 5 megaPascals (MPa) or more, and wherein the semiconductor nanocrystal is a Group II-VI compound, a Group III-V compound, a Group IV-VI compound, a Group IV element, a Group IV element, a Group IV compound, or a combination thereof.

The sealant may be the same as described above.

The semiconductor nanocrystal may be coated with a polymer including a carboxyl group or a salt thereof.

The matrix may include a polymer, an inorganic oxide, or a combination thereof.

The matrix may be a composite including the semiconductor nanocrystal or a mixture including the semiconductor nanocrystal.

The polymer may be a silicone resin; a polysiloxane resin; an epoxy resin; a poly(methyl(meth)acrylate) resin; a polymer of a first monomer including at least one thiol (SH) group at a terminal end and a siloxane second monomer or oligomer including at least one carbon-carbon unsaturated bond; a polymer of a first monomer including at least one thiol (—SH) group at a terminal end and a second monomer including at least one carbon-carbon unsaturated bond at a terminal end; or a combination thereof.

According to another embodiment of this disclosure, an optoelectronic device including a light source and the above-disclosed case disposed on the light source is provided.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

This disclosure will be described more fully hereinafter with reference to the accompanying drawings, in which various embodiments are shown. This disclosure may, however be embodied in many different forms, and should not be construed as limited to the embodiments set forth herein. Rather, these embodiments are provided so that this disclosure will be thorough and complete, and will fully convey the scope. of the invention to those skilled in the art. Like reference numerals refer to like elements throughout.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used here, the singular forms "a," "an," and "the" are intended to include the plural forms as well, unless the content clearly indicates otherwise. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art and the present disclosure, and will not be interpreted in an idealized or overly formal sense unless expressly so defined herein.

An "alkyl" group is a saturated aliphatic hydrocarbyl group having the specified number of carbon atoms, a valence of one, and optionally substituted with one or more substituents where indicated.

An "alkenyl" group is a hydrocarbyl group having the specified number of carbon atoms, a valence of one, at least one carbon-carbon double bond, and optionally substituted with one or more substituents where indicated.

An "alkynyl" group is a hydrocarbon having the specified number of carbon atoms a valence of one, at least one carbon-carbon triple bond, and optionally substituted with one or more substituents where indicated.

A "cycloalkyl" group is a hydrocarbyl group having one or more saturated rings in which all ring members are carbon, the specified number of carbon atoms, a valence of one, and optionally substituted with one or more substituents where indicated. Non-limiting examples include cyclopropyl, cyclobutyl, cyclopentyl, cyclohexyl, cycloheptyl, cyclooctyl, and adamantyl groups.

A "cycloalkenyl" group is a cycloalkyl group having at least one carbon-carbon double bond in the ring, and a "cycloalkynyl" group is a cycloalkyl group having at least one carbon-carbon triple bond in the ring. Cycloalkyl, cycloalkenyl, and cycloalkynyl groups do not contain an aromatic ring or a heterocyclic ring.

An "aryl" group is a carbocyclic ring system that includes one or more aromatic rings in which all ring members are carbon, having the specified number of carbon atoms, a valence of one, and optionally substituted with one or more substituents where indicated. More than one ring may be present, and any additional rings may be independently aromatic, saturated, or partially unsaturated and multiple rings, if present, may be fused, pendent, spirocyclic or a combination thereof. Non-limiting examples include phenyl, naphthyl, and tetrahydronaphthyl groups.

An "alkoxy" group is an alkyl group as defined above, with the indicated number of carbon atoms attached through an oxygen bridge (—O—). Non-limiting examples include methoxy, ethoxy, n-propoxy, i-propoxy, n-butoxy, 2-butoxy, and t-butoxy.

A "heterocyclic" group, is a saturated, partially unsaturated, or aromatic cyclic group having the indicated number of ring atoms, typically from 5 to 8 ring atoms, and containing from 1 to about 4 heteroatoms chosen from N, O, and S, with remaining ring atoms being carbon, or bicyclic saturated, partially unsaturated, or aromatic heterocyclic or tricyclic ring system, containing at least 1 heteroatom in the multiple ring system chosen from N, O, and S and containing up to about 4 heteroatoms independently chosen from N, O, and S in each ring of the multiple ring system. Bicyclic and tricyclic rings have the indicated number of ring atoms with bicyclic heterocyclic ring systems having from 7 to 11 ring atoms and tricyclic systems from 10 to 15 ring atoms. Non-limiting examples include pyridyl, indolyl, pyrimidinyl, pyridizinyl, pyrazinyl, imidazolyl, oxazolyl, furanyl, thiophenyl, pyridinyl, pyrimidinyl, furanyl, thienyl, pyrrolyl, piperazinyl, piperidinyl, morpholinyl and pyrrolidinyl.

An "alkylene" group is an alkyl group having the specified number of carbon atoms, a valence of two or higher, and optionally substituted with one or more substituents where indicated.

An "alkenylene" group is an alkenyl group having the specified number of carbon atoms, a valence of two or higher, and optionally substituted with one or more substituents where indicated.

A "cycloalkylene" group is cycloalkyl group having one or more saturated rings in which all ring members are carbon, the specified number of carbon atoms, a valence of two or higher, and optionally substituted with one or more substituents where indicated.

An "arylene" group is an aryl group having the specified number of carbon atoms, and a valence of two or higher wherein the points of attachment may be on the same or different rings, each of which rings may be aromatic or nonaromatic, and optionally substituted with one or more substituents where indicated. Non-limiting examples include phenylene and naphthylene.

As used herein, when a definition is not otherwise provided, the term "substituted" refers to a compound or group substituted with a C1 to C30 alkyl group, a C2 to C30 alkynyl group, a C6 to C30 aryl group, a C7 to C30 alkylaryl group, a C1 to C30 alkoxy group, a C6 to C30 aryloxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxyl group (—OH), a nitro group (—$NO_2$), a cyano group (—CN), an amino group (NRR', wherein R and R' are independently hydrogen or a C1 to C6 alkyl group), an azido group (—N3), an amidino group (—C(=NH)$NH_2$), a hydrazino group (—$NHNH_2$), a hydrazono group (=N($NH_2$)), an aldehyde group (—C(=O)H), a carbamyl group, a thiol group, an ester group (—C(=O)OR, wherein R is a C1 to C6 alkyl group or a $C_6$ to $C_{12}$ aryl group), a carboxyl group or a salt thereof, a sulfonic acid group (—$SO_3H$) or a salt thereof (—$SO_3M$, wherein M is an organic or inorganic cation), a phosphoric acid (—$PO_3H_2$) group or a salt thereof (—$PO_3MH$ or —$PO_3M_2$, wherein M is an organic or inorganic cation), or a combination thereof.

As used herein, when a definition is not otherwise provided, the prefix "hetero" refers to a compound or group including 1 to 3 heteroatoms, specifically N, O, S, Si, or P.

As used herein, the term "aliphatic organic group" may refer to a C1 to C30 linear or branched alkyl group, the term "aromatic organic group" may refer to a C6 to C30 aryl group or a C2 to C30 heteroaryl group, and the term "alicyclic organic group" may refer to a C3 to C30 cycloalkyl group, a C3 to C30 cycloalkenyl group, or a C3 to C30 cycloalkynyl group. As used herein, the term "carbon-carbon unsaturated bond-containing substituent" may be a C2 to C20 alkenyl group including at least one carbon-carbon double bond, a C2 to C20 alkynyl group including at least one carbon-carbon triple bond, a C4 to C20 cycloalkenyl group including at least one carbon-carbon double bond in a ring, or a C4 to C20 cycloalkynyl group including at least one carbon-carbon triple bond.

As used herein, the term "combination thereof" refers to a mixture, a stacked structure, a composite, an alloy, a reaction product, or the like.

As used herein, (meth)acrylate refers to an acrylate and a methacrylate, and (meth)acryloyloxy refers to an acryloyloxy and a methacryloyloxy.

The case according to an embodiment includes a case main body, a matrix including a semiconductor nanocrystal, the matrix disposed in the case main body, and a sealant disposed on the case main body. The sealant may be disposed on an opening of the case main body. The sealant may have a gas permeability of about 1 cubic centimeter at standard temperature and pressure per centimeter per meter squared per day per atmosphere ($cm^3$ (STP)·cm/$m^2$·day·atm) or less, and a tensile strength of about 5 megaPascals (MPa) or more.

Figure 1:
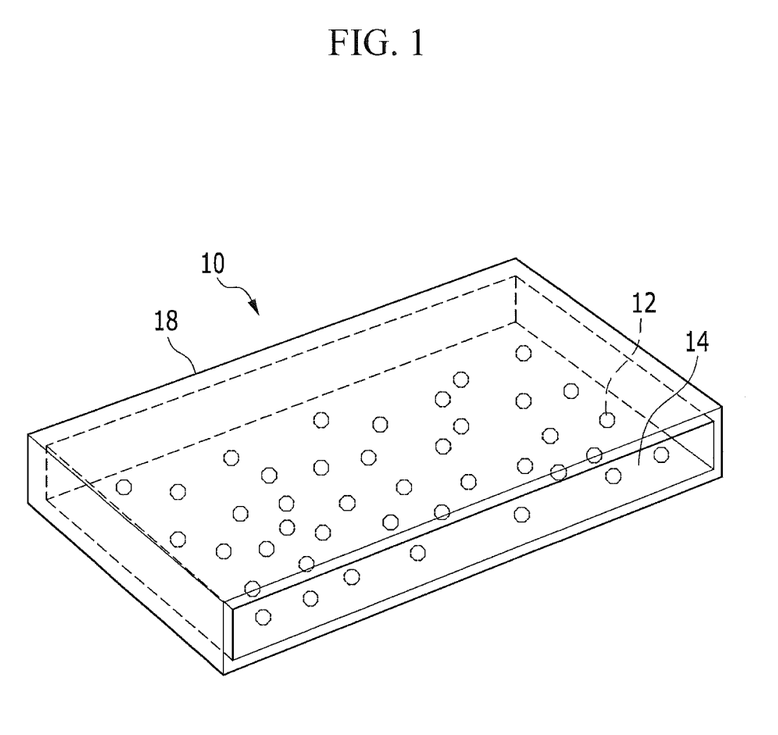
FIG. 1 is a perspective view of an embodiment of a case including semiconductor nanocrystals and a matrix before sealing the case.

The case including the matrix, which comprises the semiconductor nanocrystal, is further described referring to FIG. 1.

FIG. 1 is a perspective view showing a case 10 including semiconductor nanocrystals 12 and a matrix 14 before sealing according to an embodiment of this disclosure.

Referring to FIG. 1, the semiconductor nanocrystals 12 are dispersed in the matrix 14 and the matrix is sealed inside a case main body 18. In an embodiment, the semiconductor nanocrystals 12 are combined with the matrix 14 to form a composite, and the composite is sealed inside the case main body 18.

Figure 2:
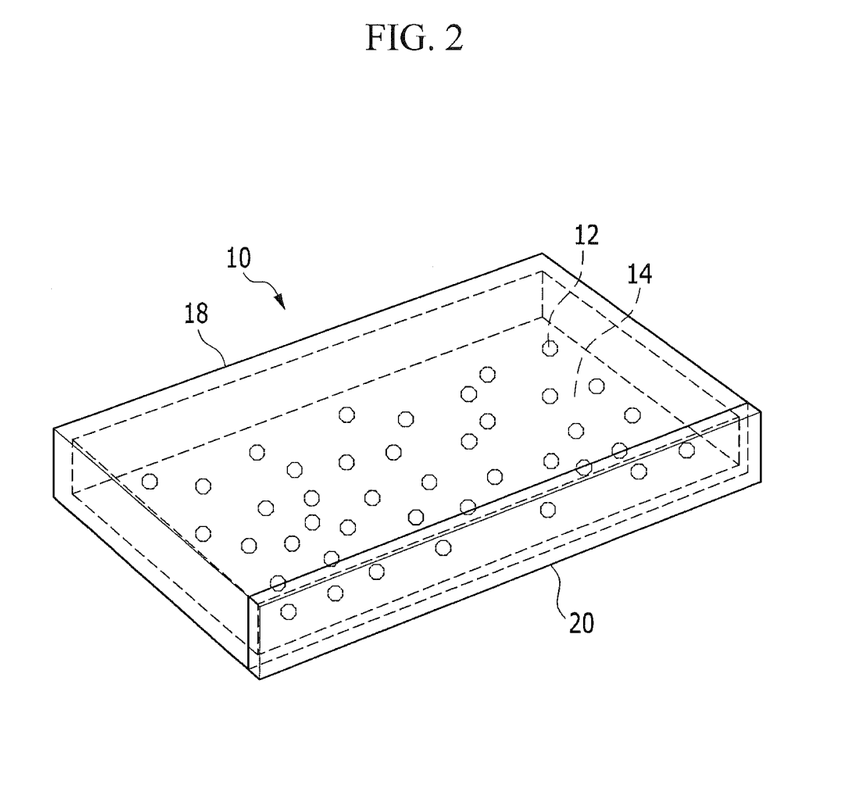
FIG. 2 is a perspective view of another embodiment of a case including semiconductor nanocrystals and a matrix after sealing the case.

FIG. 2 is a perspective view showing the case 10 including the semiconductor nanocrystals 12 and the matrix 14 after the sealing according to an embodiment of the present disclosure. Referring to FIG. 2, the opening of the case main body 18 is sealed with a sealant 20.

The sealant 20 has gas permeability of about 1 $cm^3$ (STP) ·cm/$m^2$·day·atm or less and tensile strength of 5 MPa or more. According to an embodiment of this disclosure, the sealant may have gas permeability ranging from about 0.01 to about 0.9 $cm^3$ (STP)·cm/$m^2$·day·atm, and specifically, about 0.02 to about 0.8 $cm^3$ (STP)·cm/$m^2$·day·atm.

In addition, the sealant may have tensile strength ranging from about 7 MPa to about 50 MPa, specifically, about 10 MPa to about 50 MPa, and more specifically, about 18 MPa to about 50 MPa.

The gas permeability may be measured using a continuous flow testing cell method according to by ASTM D3985. The continuous flow testing cell method is a method of measuring a specimen film with a size of about 50 $cm^3$ in a test cell at about 23° C. (about 73° F.) and about 0% relative humidity ("RH") using Mocon OX-TRAN equipment. Tensile strength is determined using a specimen with a cross-sectional dimensions of 40 millimeters (mm)×4 mm×500 micrometers (μm) measured at an extension rate of about 1 millimeter per minute (mm/min). When the sealant has the above gas permeability and tensile strength, an optoelectronic device may have improved stability and reliability.

In addition, the sealant may have a tensile modulus of more than about 1 gigaPascals (GPa). The tensile modulus may be obtained by measuring a specimen with a cross-sectional size of 40 mm×4 mm×500 μm at an extension rate of about 1 mm/min. According to an embodiment of the present disclosure, the sealant may have a tensile modulus of about 1 GPa, specifically about 1.2 GPa to about 50 GPa, more specifically about 2 GPa to about 40 GPa. When the sealant has a tensile modulus within the foregoing range, the sealant may improve stability and reliability of an optoelectronic device.

The sealant 20 may be prepared by coating a resin composition including a resin comprising an epoxy resin, a thiol-ene resin, or a combination thereof, and a curing agent, on a surface of the case main body 18, e.g. an opening of a case main body 18, and curing it at an appropriate temperature, specifically, a temperature ranging from about 0° C. to about 200° C., more specifically a temperature ranging from room temperature (about 25° C.) to about 150° C., or about 30° C. to about 125° C.

The epoxy resin may be obtained by reacting a polyhydric phenol or a polyhydric alcohol, and an epihalohydrin.

The polyhydric phenol or polyhydric alcohol may include, for example 2,2-bis(4-hydroxyphenyl)propane, 4,4'-isopropylidene diphenol (bisphenol A), bis(4-hydroxyphenyl) methane (bisphenol F), bis(4-hydroxyphenyl)sulfone (bisphenol S), 4,4'-(perfluoropropane-2,2-diyl)diphenol (bisphenol AF), phenol novolac, ortho cresol novolac, tris (hydroxyphenyl)methane, resorcinol, hydroquinone, catechol, or phloroglucinol, or the like.

The epihalohydrin may include, for example, epichlorohydrin, epibromohydrin, epifluorohydrin, or epiiodohydrin and the like.

In addition, the epoxy resin may include a commercially available product. For example, the epoxy resin may include Torrseal (Varian Inc.), Hysol 1C (Henkel AG & Co.), Hysol 608 (Henkel AG & Co.), Hysol 6C (Henkel AG & Co.), Hysol 11C (Henkel AG & Co.), Hysol 0151 (Henkel AG & Co.), or the like.

The thiol-ene resin may be a polymer of a first monomer including at least one thiol (—SH) group at a terminal end and a second monomer including at least one carbon-carbon unsaturated bond at a terminal end.

The first monomer including at least one thiol (—SH) group at a terminal end may be represented by the following Chemical Formula 1.

Chemical Formula 1

In Chemical Formula 1, $R^1$ is hydrogen; a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or a triple bond in its ring; a substituted or unsubstituted C3 to C30 heterocycloalkyl group including a double bond or a triple bond in its ring; a C3 to C30 alicyclic organic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxyl group; —$NH_2$; a substituted or unsubstituted C1 to C60 amine group of the formula —NRR' wherein R and R' are each independently hydrogen, a C1 to C30 linear or a branched alkyl group; an isocyanurate group; a (meth)acryloyloxy group; a halogen; —ROR' wherein R is a substituted or unsubstituted C1 to C20 alkylene group and R' is hydrogen or a C1 to C20 alkyl group; —C(=O)OR' wherein R' is hydrogen or a C1 to C20 alkyl group; —CN; —C(=O)ONRR' wherein R and R' are each independently hydrogen or a C1 to C20 alkyl group, or a combination thereof, $L_1$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_1$ is a single bond; a substituted or unsubstituted C1 to C30 alkylene group; a substituted or unsubstituted C2 to C30 alkenylene group; a C1 to C30 alkylene group or a C2 to C30 alkenylene group where at least one methylene group (—$CH_2$—) is substituted with a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) wherein R is hydrogen or a C1 to C10 linear or branched alkyl group, —NR— wherein R is hydrogen or a C1 to C10 linear or branched alkyl group, or a combination thereof, m is an integer of 1 or more,

$k_1$ is 0 or an integer of 1 or more, and $k_2$ is an integer of 1 or more, provided that m does not exceed the valence of $Y_1$; and provided that the sum of $k_1$ and $k_2$ does not exceed the valence of $L_1$.

In an embodiment, the sum of m and $k_2$ may be 2 to 6, specifically 2 to 5, and in another embodiment, m may be 1, $k_1$ may be 0, and $k_2$ may be 3 to 4.

The first monomer of the above Chemical Formula 1 may be a monomer of the following Chemical Formula 1-1.

Chemical Formula 1-1

In Chemical Formula 1-1, $L_1'$ is a substituted or unsubstituted C1 to C30 alkylene group, a substituted or unsubstituted C6 to C30 arylene group, for example a substituted or unsubstituted phenylene group; a substituted or unsubstituted C3 to C30 heteroarylene group, for example a triazine group; a substituted or unsubstituted C3 to C30 cycloalkylene group; or a substituted or unsubstituted C3 to C30 heterocycloalkylene group, for example a trioxotriazine group such as in Chemical Formula 1-5 below;

$Y_a$ to $Y_d$ are each independently a substituted or unsubstituted C1 to C30 alkylene group; a substituted or unsubstituted C2 to C30 alkenylene group; or an C1 to C30 alkylene group or C2 to C30 alkenylene group wherein at least one methylene group (—$CH_2$—) is substituted with a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) wherein R is hydrogen or a C1 to C10 linear or branched alkyl group, —NR— wherein R is hydrogen or a C1 to C10 linear or branched alkyl group, or a combination thereof, and $R_a$ to $R_d$ are each independently a thiol group (—SH), or one or more of the groups $R_a$—$Y_a$—, $R_b$—$Y_b$—, $R_c$—$Y_c$—, and $R_d$—$Y_d$— are $R_1$ of Chemical Formula 1, provided that at least two of $Y_a$ to $Y_d$ is as defined above and at least one of $R_a$ to $R_d$ is a thiol group (—SH).

The first monomer of the above Chemical Formula 1 may include the compounds represented by the following Chemical Formulas 1-2 to 1-5.

Chemical Formula 1-2

Chemical Formula 1-3

-continued

Chemical Formula 1-4

Chemical Formula 1-5

The second monomer including at least one carbon-carbon unsaturated bond at a terminal end may be represented by the following Chemical Formula 2.

Chemical Formula 2

In Chemical Formula 2,

X is a C2 to C30 aliphatic organic group including a carbon-carbon unsaturated bond, a C6 to C30 aromatic organic group including a carbon-carbon unsaturated bond-containing substituent, or a C3 to C30 alicyclic organic group including a carbon-carbon unsaturated bond, or a combination thereof, $R^2$ is hydrogen; a substituted or unsubstituted C1 to C30 alkyl group; a substituted or unsubstituted C6 to C30 aryl group; a substituted or unsubstituted C6 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or a triple bond in its ring; a substituted or unsubstituted C3 to C30 heterocycloalkyl group including a double bond or a triple bond in its ring; a C3 to C30 alicyclic organic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxyl group; —$NH_2$; a substituted or unsubstituted C1 to C30 amine group; an isocyanate group; an isocyanurate group; a (meth)acryloyloxy group; a halogen; —ROR' wherein R is a substituted or unsubstituted C1 to C20 alkylene group and R' is hydrogen or a C1 to C20 alkyl group; an acyl halide group (—RC(=O)X) wherein R is a substituted or unsubstituted C1 to C20 alkylene group and X is a halogen; —C(=O)OR' wherein R' is hydrogen or a C1 to C20 alkyl group; —CN; —C(=O)ONRR' wherein R and R' are each independently hydrogen or a C1 to C20 alkyl group, or a combination thereof, $L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_2$ is a single bond; a substituted or unsubstituted C1 to C30 alkylene group; a substituted or unsubstituted C2 to C30 alkenylene group; or a C1 to C30 alkylene group; or a C2 to C30 alkenylene group where at least one methylene group (—$CH_2$—) is substituted with a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) wherein R is hydrogen or a C1 to C10 linear or branched alkyl group, —NR— wherein R is hydrogen or a C1 to C10 linear or branched alkyl group, or a combination thereof, n is an integer of 1 or more, $k_3$ is an integer of 0 or 1 or more, and $k_4$ is an integer of 1 or more, provided that n does not exceed the valence of $Y_2$; and provided that the sum of $k_3$ and $k_4$ does not exceed the valence of $L_2$.

In an embodiment, the sum of n and $k_4$ may be 2 to 6, specifically 2 to 5, and in another embodiment n may be 1, $k_3$ may be 0, and $k_4$ may be 3 to 4.

In Chemical Formula 2, X may be a C2 to C30 aliphatic organic group including a carbon-carbon double bond or a carbon-carbon triple bond, a C6 to C30 aromatic organic group including a substituent having a carbon-carbon double bond or a carbon-carbon triple bond, or a C3 to C30 alicyclic organic group including a carbon-carbon double bond or a carbon-carbon triple bond, or a combination thereof.

Examples of X may also include an acryloyloxy group, a methacryloyloxy group, a substituted or unsubstituted C2 to C30 alkenyl group, a substituted or unsubstituted C2 to C30 alkynyl group, a substituted or unsubstituted C3 to C30 alicyclic organic group including a double bond or a triple bond in its ring, a substituted or unsubstituted C3 to C30 heterocycloalkyl group including a double bond or a triple bond in its ring, a C3 to C30 alicyclic organic group substituted with a C2 to C30 alkenyl group or a C2 to C30 alkynyl group, or a C3 to C30 heterocycloalkyl group substituted with a C2 to C30 alkenyl group or a C2 to C30 alkynyl group, or a combination thereof.

In Chemical Formula 2, $L_2$ is a substituted or unsubstituted pyrrolidinyl group, a substituted or unsubstituted tetrahydrofuranyl, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group such as in Chemical Formula 2-4 below, or a substituted or unsubstituted isocyanurate group.

The second monomer of the Chemical Formula may include the compound represented by the following Chemical Formulas 2-1 and 2-2.

Chemical Formula 2-1

Chemical Formula 2-2

In Chemical Formulas 2-1 and 2-2, $Z_1$ to $Z_3$ are each independently *—$Y_2$—X, as defined for the above Chemical Formula 2, wherein * represents the point of attachment to $L_2$.

Examples of the second monomer of the above Chemical Formula 2 may include the compounds represented by the following Chemical Formulas 2-3 to 2-5.

Chemical Formula 2-3

Chemical Formula 2-4

Chemical Formula 2-5

The first monomer including at least one thiol (—SH) group at a terminal end and the second monomer including at least one carbon-carbon unsaturated bond at a terminal end may be used so that the thiol group of the first monomer and the unsaturated carbon-carbon bond of the second monomer may be present at a mole ratio of about 1:0.75 to about 1:1.25, specifically about 1:0.8 to about 1:1.20, more specifically 1:0.9 to about 1:1.15. When the above monomers are used within the foregoing mole ratio range, a polymer having excellent mechanical strength and properties due to a high density network may be provided.

A curing agent for the epoxy resin may include: an imidazole-based curing agent such as 2-ethyl imidazole, 4-methyl imidazole, 2-methyl imidazole, 2-heptadecylimidazole, 2-phenyl imidazole, or the like; an acid anhydride-based curing agent such as tetrahydro phthalic anhydride, methyl tetrahydro phthalic anhydride, or the like; a tertiary amine-based curing agent such as diazabicycloundecene, or the like; or dicyandiamide, but is not limited thereto.

A curing agent for the thiol-ene resin may be an initiator, and examples of the initiator may include phosphine oxide, α-amino ketone, phenylglyoxylate, monoacyl phosphine, benzylmethyl-ketal, hydroxyketone, or the like.

The sealant may include plate-shaped particles to effectively a lower gas permeability. The plate-shaped particles in the sealant may extend and block a path through which gas is permeated and further decrease gas permeability of the sealant.

The plate-shaped particles may include an inorganic oxide, a carbon-containing material, a metal-containing material, or a combination thereof, but is not limited thereto. The plate-shaped particles may not be limited to a specific material, and any plate-shaped particles may be used without limitation. Examples of the plate-shaped particle may include a clay, graphene, graphite oxide, graphite nanoplatelets, and metal flakes, for example zinc flakes, iron flakes, or the like, but is not limited thereto.

The clay may include pyrophyllite-talc, montmorillonite ("MMT"), fluorinehectorite, kaolinite, vermiculite, illite, mica, brittle mica, or a mixture thereof.

The clay may be treated with an organic modifying agent and exfoliated into layers. The organic modifying agent with a low molecular weight is inserted into layers of the clay with a hard structure for exfoliation and dispersion due to a Van der Weals interaction, making a matrix that may be easily inserted into the layers of the clay and a clay structure that has easy exfoliation and dispersion.

The organic modifying agent may include a substituted or unsubstituted C1 to C20 alkylamine or an acceptable salt thereof, a C1 to C20 alkylene diamine, a C1 to C20 quaternary ammonium salt, an aminohexane, or a nitrogen-containing heterocyclic compound.

The alkylamine may include, for example, a methylamine hydrochloride, a propylamine, a butylamine, an octylamine, a decylamine, a dodecylamine, a hexadecylamine, an octadecyl amine, an N-methyloctadecyl amine, or the like. The alkylene diamine may include, for example, 1,6-hexamethylenediamine, 1,12-dodecanediamine, or the like. The quaternary ammonium salt may include, for example dimethyl ethylbenzyl ammonium dichloride, benzyltris(2-ethylhexyl)ammonium bromide, bis(2-hydroxyethyl) benzyl quaternary ammonium chloride, tetramethylammonium chloride, octadecyl trimethyl ammonium bromide, dodecyltrimethyl ammonium bromide, dioctadecyldimethyl ammonium bromide, or bis-(2-hydroxyethyl) methyl octadecyl ammonium chloride, or the like. The aminohexane may include 6-aminohexane, 12-aminohexane, or the like, or the nitrogen-containing heterocyclic compound may include 1-hexadecylpyridium chloride, or the like.

In addition, while the clay may be treated with the organic modifying agent, an organized clay may also be used. The organized clay may include Cloisite6A, Cloisite10A, Cloisite15A, Cloisite20A, Cloisite25A, Cloisite30B, and the like, made by Southern Co., and in an embodiment, Cloisite10A is specifically mentioned.

The plate-shaped particle may have an aspect ratio, determined as a thickness/long-axis length, ranging from about 1/100,000 to about 1/10, specifically, from about 1/1,000 to about 1/50, and more specifically, from about 1/800 to about 1/100. When the plate-shaped particles have an aspect ratio within this range, the plate-shaped particles may effectively decrease gas permeability of the sealant.

In addition, the plate-shaped particles may have a long-axis length ranging from about 0.05 micrometers (μm) to about 100 μm, and specifically, from about 0.1 μm to about 10 μm. When the plate-shaped particles have a long-axis length within this range, the plate-shaped particles may effectively reduce gas permeability of the sealant.

The plate-shaped particles may be included in an amount of about 2 to about 100 parts by weight, and specifically about 20 to about 90 parts by weight based on 100 parts by weight of a resin, wherein the resin may comprise an epoxy resin, a thiol-ene resin, or a combination thereof. When used within this range, the plate-shaped particles may not deteriorate properties of a sealant and may improve the gas permeability of a sealant.

The curing process of the resin, which may comprise an epoxy resin, a thiol-ene resin, or a combination thereof, may be performed at a temperature ranging from about 0° C. to about 200° C., and specifically, at room temperature (about 25° C.) to 150° C. In addition, the curing process may be performed without a solvent but may generate no gas.

The case main body 18, as shown in FIG. 1, may have a shape such as a rectangle, a cylinder, a cup, or the like, but is not particularly limited thereto.

The semiconductor nanocrystals 12, as shown in FIG. 1, may be red, green, yellow, or blue-emitting light emitting particles. The semiconductor nanocrystals 12 may include a Group II-VI compound, a Group III-V compound, a Group IV-VI compound, a Group IV element, a Group IV compound, or a combination thereof, wherein the term "Group" refers to a Group of the Periodic Table of the Elements.

The Group II-VI compound may include a binary compound, e.g., CdSe, CdTe, ZnS, ZnSe, ZnTe, ZnO, HgS, HgSe, HgTe, MgSe, MgS, or a combination thereof; a ternary compound, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary compound, e.g., HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group III-V compound may include a binary compound, e.g., GaN, GaP, GaAs, GaSb, AlN, AlP, AlAs, AlSb, InN, InP, InAs, InSb, or a combination thereof; a ternary compound, e.g., GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; or a quaternary compound, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group IV-VI compound may include a binary compound, e.g., SnS, SnSe, SnTe, PbS, PbSe, PbTe, or a combination thereof; a ternary compound, e.g., SnSeS, SnSeTe, SnSTe, PbSeS, PbSeTe, PbSTe, SnPbS, SnPbSe, SnPbTe, or a combination thereof; or a quaternary compound e.g., SnPbSSe, SnPbSeTe, SnPbSTe, or a combination thereof. The Group IV element may include Si, Ge, or a combination thereof. The Group IV compound may include a binary compound, e.g., SiC, SiGe, or a combination thereof.

The element, the binary compound, the ternary compound, or the quaternary compound may each be present as a particle having a substantially uniform concentration, or may be present as a particle having different concentration distributions in the same particle. In addition, each particle may have a core/shell structure in which a first semiconductor nanocrystal is surrounded by a second semiconductor nanocrystal. The core and shell may have an interface, and an element of at least one of the core or the shell may have a concentration gradient that decreases in a direction from the surface of the particle to a center of the particle.

In addition, the semiconductor nanocrystal may have a structure including a semiconductor nanocrystal core and a multi-layer shell surrounding the same. The multi-layer shell may have a two or more layered shell structure. Each layer may have a single composition or an alloy or concentration gradient.

In addition, the semiconductor nanocrystal may have a structure effectively showing the quantum confinement effect since the material composition for the shell has a higher energy band gap than that of the core. When the semiconductor nanocrystal has a multi-layered shell surrounding the core, the energy band gap of the shell disposed on the exterior of the core is higher than the shell closer to the core. The semiconductor nanocrystal may have an ultraviolet ("UV") to infrared wavelength range.

The semiconductor nanocrystal may have quantum efficiency of about 30% to about 100%, for example about 50% or more, or 70% or more, or about 90% or more. Within this range, it may improve the luminous efficiency of a device.

In addition, the full width of half maximum ("FWHM") of the light emitting wavelength spectrum of the semiconductor nanocrystals may be selected to be narrower or wider according to the application field. It may have a narrower spectrum in order to improve the color purity or the color reproducibility in a display. In this regard, the semiconductor nanocrystals may have the FWHM of a light emitting wavelength spectrum of about 50 nanometers (nm) or less, for example, about 50 nm or less, or about 40 nm or less. In the foregoing range, it may improve the color purity or the color reproducibility of a device. In addition, when the semiconductor nanocrystals are used for lighting or the like, the semiconductor nanocrystals having the various light emitting wavelengths are mixed in order to improve the color rendering index ("CRI"), or the FWHM is designed to be wider. In this case, the FWHM may range from about 60 nm to about 200 nm.

The semiconductor nanocrystals may have a particle diameter (e.g., an average largest particle diameter) ranging from about 1 nanometer (nm) to about 100 nm, and specifically about 1 nm to about 10 nm.

In addition, the nanocrystals may have a commercially-used shape in this art, and the shape is not specifically limited. Examples thereof may include spherical, pyramidal, multi-armed, or cubic nanoparticles, nanotubes, nanowires, nanofiber, nanoplate particles, or the like.

The nanocrystal may be synthesized according to a commercially available method known in this art. For example, the nanocrystal may be synthesized according to the following method. The method of synthesizing the nanocrystal is not limited to the following method, and it may be synthesized according to any method known in the art.

For example, several nano-sized semiconductor nanocrystals may be synthesized according to a wet chemical process that adds a precursor material into an organic solvent and develops the particles. This is a method of controlling crystal development by naturally coordinating an organic solvent or an organic ligand on the surface of the semiconductor nanocrystal while the crystal is developed. The organic solvent coordinated on the surface of the nanocrystal may affect the stability of the device, so excessive organic material that is not coordinated on the surface of the nanocrystal may be removed by washing three times and centrifugation. After removing the excessive organic material, the amount of organic material coordinated on the surface of the nanocrystal may be about 50 weight (wt %) or less of the nanocrystal weight. With a nanocrystal size of about 20 nm or less, the organic material is coordinated in a range of about 10 wt % to about 50 wt %, for example, about 15 wt % to about 30 wt %, based on the weight of the nanocrystal. The organic material may be a monomer or an oligomer having a molecular weight of about 300 grams/mole or more, or a polymer having a molecular weight ("Mw") of about 5000 grams/mole or more.

The semiconductor nanocrystal 12, as shown in FIG. 1, may be coated with a polymer including a carboxyl group or a salt thereof. The carboxyl group may be an acrylic acid group, a methacrylic acid group, or a salt thereof. The polymer including a carboxyl group or a salt thereof may include a structural unit including a carboxyl group or a salt thereof in an amount ranging from about 1 to about 100 mol %, specifically about 2 to about 50 mol %, more specifically about 4 to about 20 mol %. When the structural unit including a carboxyl group or a salt thereof is included in a polymer within the above range, the structural unit may improve the stability of a semiconductor nanocrystal coated with the polymer. The polymer may have a melting point ("$T_m$") ranging from about 50 to about 300° C., specifically about 60° C. to about 250° C., more specifically about 70° C. to about 200° C. When the polymer has a melting point ("$T_m$") within the range, the polymer may stably coat a semiconductor nanocrystal 12.

The semiconductor nanocrystal 12 coated with the polymer including a carboxyl group or a salt thereof may be fabricated into a powder or a film. The polymer including a carboxyl group or a salt thereof may include a carboxyl group or a salt thereof, in a long aliphatic chain, for example, a C8 to C50 or a C12 to C36 aliphatic chain.

The polymer including a carboxyl group or salt thereof may include a poly(alkylene-co-acrylic acid) such as poly(ethylene-co-acrylic acid) or the like, a poly(alkylene-co-methacrylic acid) such as poly(ethylene-co-methacrylic acid) or the like, or a salt thereof. The salt may include a compound including a metal such as sodium, zinc, indium, gallium, or the like instead of a hydrogen of a carboxyl group. The salt may include a poly(ethylene-co-acrylic acid)zinc salt, a poly(ethylene-co-methacrylic acid)zinc salt, or the like.

The polymer including a carboxyl group or a salt thereof may be present in an amount of about 50 to about 10,000 parts by weight, and specifically, about 150 to about 10,000 parts by weight based on 100 parts by weight of a semiconductor nanocrystal 12, as shown in FIG. 1. The semiconductor nanocrystal 12 coated with the polymer including a carboxyl group or a salt thereof may be present in an amount ranging from about 1 wt % to about 70 wt %, specifically about 1 wt % to about 40 wt %, based on the total weight of the semiconductor nanocrystal 12 and the polymer including a carboxyl group or a salt thereof. When the semiconductor nanocrystal 12 is coated within this range, the semiconductor nanocrystal 12 may have improved stability.

The matrix 14, as shown in FIG. 1, may comprise a polymer, an inorganic oxide, or a combination thereof.

The polymer may include a silicone resin; a polysiloxane resin; an epoxy resin; a poly(methyl(meth)acrylate) resin; a polymer of a first monomer including at least one thiol (—SH) group at a terminal end and a siloxane-based second monomer or oligomer including at least one carbon-carbon unsaturated bond at a terminal end; a polymer of a first monomer including at least one thiol (—SH) group at a terminal end and a second monomer including at least one carbon-carbon unsaturated bond at a terminal end, or a combination thereof. In an embodiment, the first monomer including at least one thiol (—SH) group at a terminal end and the second monomer including at least one carbon-carbon unsaturated bond at a terminal end may be the same as described above for a thiol-ene resin used to prepare a sealant.

The siloxane-based second monomer or oligomer including at least one carbon-carbon unsaturated bond may be represented by the following Chemical Formula 3.

Chemical Formula 3

In Chemical Formula 3, $X^1$ to $X^3$ are each independently a C1 to C10 alkyl group, a C2 to C30 aliphatic organic group including a carbon-carbon unsaturated bond, a C6 to C30 aromatic organic group including a carbon-carbon unsaturated bond-containing substituent, or a C3 to C30 alicyclic organic group including a carbon-carbon unsaturated bond, provided that at least one of $X^1$ to $X^3$ are not hydrogen, $R^1$ to $R^7$ are each independently a C1 to C10 alkyl group; a halogen; a substituted or unsubstituted C1 to C30 alkyl group; a substituted or unsubstituted C6 to C30 aryl group; a substituted or unsubstituted C6 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or a triple bond in its ring; a substituted or unsubstituted C3 to C30 heterocycloalkyl group including a double bond or a triple bond in its ring; a C3 to C30 alicyclic organic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxyl group; —$NH_2$; a substituted or unsubstituted C1 to C30 amine group; an isocyanate group; an isocyanurate group; a (meth)acryloyloxy group; a halogen; —ROR' wherein R is a substituted or unsubstituted C1 to C20 alkylene group and R' is hydrogen or a C1 to C20 alkyl group; an acyl halide group of the formula —RC(=O)X wherein R is a substituted or unsubstituted C1 to C20 alkylene group and X is a halogen; —C(=O)OR' wherein R' is hydrogen or a C1 to C20 alkyl group; —CN; or —C(=O)ONRR' wherein R and R' are each independently hydrogen or a C1 to C20 alkyl group, and n and m are each independently an integer ranging from 0 to 300.

In Chemical Formula 3, $X^1$ to $X^3$ may be an acryloyloxy group; a methacryloyloxy group; a substituted or unsubstituted C2 to C30 alkenyl group; a substituted or unsubstituted C2 to C30 alkynyl group; a substituted or unsubstituted C3 to C30 alicyclic organic group including a double bond or a triple bond in its ring; a substituted or unsubstituted C3 to C30 heterocycloalkyl group including a double bond or a triple bond in its ring; a C3 to C30 alicyclic organic group substituted with a C2 to C30 alkenyl group or a C2 to C30 alkynyl group; or a C3 to C30 heterocycloalkyl group substituted with a C2 to C30 alkenyl group or a C2 to C30 alkynyl group.

The siloxane-based second monomer or oligomer including at least one carbon-carbon unsaturated bond may have a molecular weight ranging from about 500 grams/mole to about 100,000 grams/mole and specifically, about 1,000 grams/mole to about 10,000 grams/mole. Herein, the molecular weight indicates a weight average molecular weight as for a polymer. When the siloxane-based second monomer or oligomer has a molecular weight within this range, reactivity of the siloxane-based second monomer or oligomer with the first monomer including at least one thiol (—SH) group may be easily selected.

The first monomer including at least one thiol (—SH) group at a terminal end and the siloxane-based second monomer or oligomer including at least one carbon-carbon unsaturated bond may be used so that the thiol group of the first monomer and the unsaturated carbon-carbon bond of the second monomer or oligomer may be present at a mole ratio of about 1:0.75 to about 1:1.25. When the above monomers are used within the mole ratio range, a polymer having excellent mechanical strength and properties due to a high density network may be provided.

The matrix 14, as shown in FIG. 1, may include an inorganic oxide such as silica.

The matrix 14 may be a composite comprising the semiconductor nanocrystal 12 or a mixture comprising the semiconductor nanocrystal 12.

The case 10 including the semiconductor nanocrystal 12 may be stably closed and sealed to protect the semiconductor nanocrystal from the external environment. The case comprising the semiconductor nanocrystal 12 is disposed on an optoelectronic device and thus may improve stability and reliability thereof. The optoelectronic device may include a light emitting device such as a light emitting diode ("LED") device, or an organic light emitting diode ("OLED"), a memory device, a laser device, a solar cell, or the like.

Figure 3:
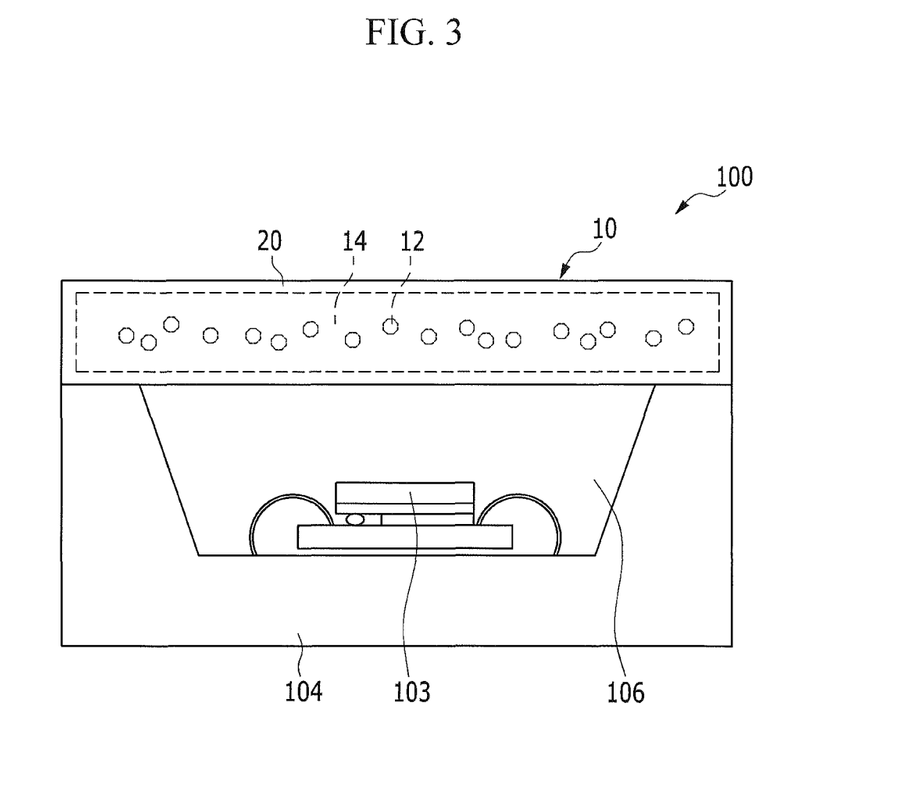
FIG. 3 is a schematic diagram of an embodiment of a light emitting diode including an emission layer in which a case including semiconductor nanocrystals and a matrix is disposed.

According to an embodiment, a light emitting diode device including the case 10 comprising a semiconductor nanocrystal 12 is shown in FIG. 3.

FIG. 3 is the schematic diagram of a light emitting diode 100 to which a case 10 including a semiconductor nanocrystal 12 and a matrix 14 is disposed as an emission layer.

Referring to FIG. 3, the light emitting diode 100 includes a substrate 104, a light emitting diode chip 103 emitting blue or ultraviolet ("UV") light on the substrate 104, a polymer 106 disposed in the recess portion of the substrate 104, and the case 10 including the semiconductor nanocrystal 12 and the matrix 14 disposed on the polymer 106 as shown in FIG. 3.

The polymer 106 may include a silicone resin; a polysiloxane resin; an epoxy resin; a poly(methyl(meth)acrylate) resin; a polymerized polymer resin of a first monomer including at least one thiol (—SH) group at a terminal end and a siloxane-based second monomer or oligomer including at least one carbon-carbon unsaturated bond at a terminal end; a polymer of a first monomer including at least one thiol (—SH) group at a terminal end and a second monomer including at least one carbon-carbon unsaturated bond at a terminal end; or a combination thereof. According to an embodiment, the first monomer including at least one thiol (—SH) group at a terminal end and the second monomer including at least one carbon-carbon unsaturated bond at a terminal end is the same as described above for a thiol-ene resin used to prepare a sealant. According to another embodiment, the first monomer including at least one thiol (—SH) group at a terminal end and siloxane-based second monomer or oligomer including at least one carbon-carbon unsaturated bond at a terminal end are the same as described above for a matrix.

Hereinafter, an embodiment is illustrated in more detail with reference to examples. However, the following are exemplary embodiments and shall not be limiting of the claims.

Preparation Example 1

Synthesis of a Semiconductor Nanocrystal

About 16 grams (g) of trioctylamine ("TOA"), about 0.3 g of octadecyl phosphonic acid, and about 0.4 millimole (mmol) of cadmium oxide are simultaneously introduced into a 125 milliliters (mL) flask mounted with a reflux condenser, placed under vacuum while being agitated, and then heated up to about 120° C. When the reactant reaches a temperature of about 120° C., nitrogen is flowed therein, and the reaction is then heated up to about 300° C.

Separately, selenium (Se) powder is dissolved in trioctylphosphine (TOP), providing a 2 Molar (M) Se-TOP complex solution. About 2 mL of the 2M Se-TOP complex solution is quickly injected into the about 300° C. reaction mixture while being agitated and reacted for about 2 minutes.

When the reaction is complete, the reaction mixture is quickly cooled down to room temperature (about 25° C.), and ethanol as a non-solvent is added thereto. The resulting mixture is centrifugated. Then, a CdSe nanocrystal solution emitting light at about 485 nm is synthesized; the supernatant of the solution excluding the centrifuged precipitate is discarded, and the precipitate is dispersed in toluene.

About 8 g of TOA, about 0.1 g of oleic acid, and about 0.4 mmol of zinc acetate are simultaneously introduced into a 125 ml flask mounted with a reflux condenser and then heated up to about 300° C. while being agitated. About 1 wt % of the synthesized CdSe nanocrystal solution is added to the above reactant, and about 2 ml of a 0.4 M S-TOP complex solution is slowly added thereto. The mixture is reacted for about one hour, growing ZnS nanocrystals on the surface of the CdSe nanocrystals and forming CdSe//ZnS alloy nanocrystals at the interface through diffusion.

When the reaction is complete, the reaction mixture is cooled down to room temperature (about 25° C.) as fast as possible, and ethanol as a non-solvent is added thereto. The mixture is centrifugated. Then, the supernatant of the solution excluding the centrifugated precipitate is discarded. The precipitate is dispersed in toluene, synthesizing about a 5 nm-sized CdSe//ZnS alloy nanocrystal solution emitting light at about 458 nm.

About 8 g of TOA, about 0.1 g of oleic acid, about 0.05 mmol of cadmium oxide, and about 0.4 mmol of zinc acetate are simultaneously introduced into a 125 ml flask mounted with a reflux condenser and heated up to about 300° C. while being agitated. About 1 wt % of the CdSe//ZnS nanocrystal solution synthesized above is added to the reactant, and about 2 ml of a 0.4 M S-TOP complex solution is slowly added thereto. The mixture is reacted for about one hour, growing CdSZnS nanocrystals on the surface of CdSe//ZnS nanocrystals, to provide CdSe//ZnS/CdSZnS nanocrystals emitting light at about 535 nm.

When the reaction is complete, the reaction mixture is cooled down to room temperature (about 25° C.) as fast as possible, and ethanol as a non-solvent is added thereto. The mixture is centrifugated. Then, a supernatant of the solution excluding the centrifugated precipitate is discarded. The precipitate is dispersed in toluene, synthesizing a CdSe//ZnS/CdSZnS red semiconductor nanocrystal solution. The red semiconductor nanocrystal is confirmed to have quantum efficiency of about 93%.

Example 1

Fabrication of Light Emitting Diode ("LED") Device

A solvent prepared by mixing hexane and ethanol in a volume ratio of about 6:about 4 is added to the CdSe//ZnS/CdSZnS red semiconductor nanocrystal emitting light at about 535 nm prepared according to Preparation Example 1, and the mixture is centrifugated for about 10 minutes at about 6000 revolutions per minute ("rpm"), obtaining a precipitate.

The precipitate is added to a chloroform solvent, preparing an about 1 wt % solution. Then, OE6630 made by Dow Corning Co., is used as a silicone resin. About 100 µl of the chloroform solution including about 1 wt % of the semiconductor nanocrystal prepared as above, is mixed with about 0.5 g of the silicone resin. The mixture is agitated until it becomes uniform and then maintained under vacuum for about one hour to remove a chloroform solution, preparing a composition.

The composition is injected into a capillary tube with a diameter of about 3 centimeters (cm), and the capillary tube is cut to about 5 cm in length, preparing a case main body. The composition is cured at about 150° C. for about 2 hours, preparing a semiconductor nanocrystal-silicone resin composite.

OE6630 made by Dow Corning Co., is coated in the recess portion of a substrate internally including a blue LED chip and cured at about 150° C. for about 2 hours. Next, the case main body, prepared as above, is disposed on the cured substrate, and a sealant mixture of an epoxy resin and plate-shaped particles is coated on a surface of the case main body and cured at about 25° C. for more than about 8 hours, to prepare a case disposed on a light source, thereby fabricating a light emitting diode device. The epoxy resin includes epichlorohydrin-4,4'-isopropylene diphenol, and the plate-shaped particle includes montmorillonite ("MMT") with a thickness/long-axis length ratio of about 1/100. The MMT is used at about 80 parts per hundred resin ("phr").

The gas permeability of the sealant is measured using a continuous flow testing cell method. The result is the sealant has a gas permeability of about 0.2 cm$^3$ (STP)·cm/m$^2$·day·atm. The tensile strength and tensile modulus of the sealant is measured by using a specimen of the sealant with a cross-sectional size of 40 mm×4 mm×500 µm, at an extension rate of about 1 mm/min. The results are about 21 MPa and about 1.25 GPa, respectively.

Example 2

Fabrication of Light Emitting Diode ("LED") Device

A light emitting diode device is fabricated according to the same method as Example 1, except for using a thiol-ene resin instead of a mixture of an epoxy resin and plate-shaped particles, as the sealant. The thiol-ene resin is prepared by mixing pentalerythritol tetrakis (3-mercapto propionate) as a first monomer and 1,3,5-triallyl-1,3,5-triazinane-2,4,6-trione as a second monomer in a mole ratio of 3:4, adding 1 part by weight of an initiator, Irgacure 754 (Ciba-Geigy Corp.), based on 100 parts by weight of the sum of the first and second monomers, and then exposing the mixture to ultraviolet radiation ("UV"), to prepare a sealant. The sealant is coated on a surface of the case main body and cured at about 25° C. for more than about 8 hours, preparing a case disposed on a light source, thereby fabricating a light emitting diode device. The gas permeability of the sealant is measured using in a continuous flow testing cell method. The result is the sealant has gas permeability of about 0.1 cm$^3$ (STP)·cm/m$^2$·day·atm. The tensile strength of the sealant is measured at an extension rate of about 1 millimeters per minute (mm/min) by using a specimen of the sealant with a cross-sectional size of 40 mm×4 mm×500 µm. The result is the sealant has tensile strength of about 7 MPa.

Comparative Example 1

Fabrication of Light Emitting Diode ("LED") Device

A light emitting diode is fabricated according to the same method as Example 1, except for using a bisphenol-containing epoxy resin (SJ-4500A/B, SJC Co. Ltd.) instead of a mixture of an epoxy resin and plate-shaped particles as the sealant. The gas permeability of the sealant is measured using a continuous flow testing cell method, and the sealant has a gas permeability of about 1.5 cm$^3$ (STP)·cm/m$^2$·day·atm. The tensile strength and tensile modulus of the sealant are measured by using a specimen of the sealant with a cross-sectional size of 40 mm×4 mm×500 µm at an extension rate of about 1 mm/min. The sealant has a tensile strength of about 17 MPa and a tensile modulus of about 0.7 GPa.

Comparative Example 2

Fabrication of Light Emitting Diode (LED) Device

A light emitting diode is fabricated in the same method as Example 1, except for using a RTV®sealant (manufactured by Momentive Inc.) instead of a mixture of an epoxy resin and a plate-shaped particle as the sealant. The sealant has tensile strength of 2.2 MPa measured by using a specimen with a cross-sectional size of 40 mm×4 mm×500 µm at an extension rate of about 1 mm/min. RTV (Momentive Inc.) according to Comparative Example 2 has lower tensile strength than the bisphenol-containing epoxy resin according to Comparative Example 1.

Figure 4:
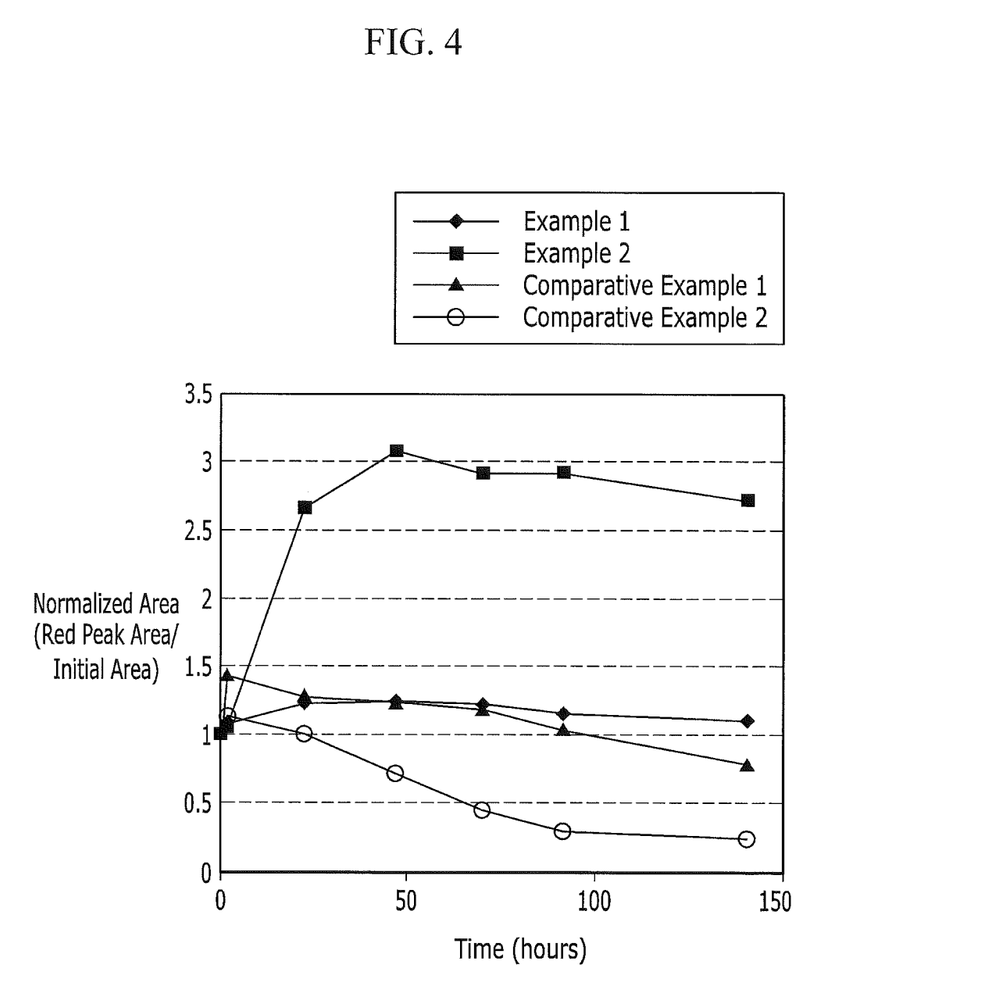
FIG. 4 is a graph normalized peak area (red peak area/ initial peak area) versus time (hours) showing a ratio of a red light emitting peak area relative to an initial light emitting peak area depending on operation time of the light emitting diodes according to Examples 1 and 2 and Comparative Examples 1 and 2.

The light emitting diodes according to Examples 1 and 2 and Comparative Example 1 and 2 are evaluated to determine light emitting characteristics through an integrating sphere system by using an ISP75 system to measure luminous efficiency. The light emitting diodes are operated at 60° C. under relative humidity of 95% with 120 milliAmps (mA)/3.3 volts (V). The results, a ratio of the red light emitting peak areas of the light emitting diodes relative to the initial light emitting peak areas thereof, are provided in FIG. 4. In FIG. 4, the sealants prepared according to Examples 1 and 2 have excellent gas permeability and tensile strength, showing that light emitting diode devices prepared according to Examples 1 and 2 maintain a red peak area relative to an initial peak area up to about 150 hours. On the contrary, since the sealants prepared according to Comparative Examples 1 and 2 do not have good gas permeability, the light emitting diode devices prepared according to Comparative Examples 1 and 2 have a sharply deteriorated red peak area relative to an initial peak area as time passes. Since the light emitting diode devices have almost no area change of blue light emitting, the area change of a red peak in FIG. 4 shows luminous efficiency of which the red semiconductor nanocrystal receives blue light and transforms it into red light. Accordingly, the light emitting diode devices prepared according to Examples 1 and 2 maintain stable luminous efficiency as time passes.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emitting diode comprising:
   a substrate having a recess portion;
   a light source disposed in the recess portion of the substrate; and
   a case disposed on the light source in the recess portion of the substrate, wherein the case comprises
a case main body;
a matrix comprising a semiconductor nanocrystal, the matrix disposed in the case main body; and
a sealant disposed on the case main body, wherein the sealant has a gas permeability of about 1 cubic centimeter at standard temperature and pressure per centimeter per meter squared per day per atmosphere or less and a tensile strength of about 5 megaPascals or more, and
wherein the semiconductor nanocrystal is a Group II-VI compound, a Group III-V compound, a Group IV-VI compound, a Group IV element, a Group IV element, a Group IV compound, or a combination thereof, and wherein the sealant comprises an epoxy resin and a plate-shaped particle, or a thiol-ene resin.

2. The light emitting diode of claim 1, wherein the sealant has a tensile modulus of more than about 0.7 gigaPascals.

3. The light emitting diode of claim 1,
wherein the epoxy resin is a polymerization product of a polyhydric phenol or a polyhydric alcohol, and an epihalohydrin, and
the thiol-ene resin is a polymer of a first monomer comprising at least one thiol group at a terminal end and a second monomer comprising at least one carbon-carbon unsaturated bond at a terminal end.

4. The light emitting diode of claim 1, wherein the plate-shaped particle comprises an inorganic oxide, a carbon-containing material, a metal-containing material, or a combination thereof.

5. The light emitting diode of claim 4, wherein the plate-shaped particle is a clay, graphene, graphite oxide, a graphite nanoplatelet, a metal flake, or a combination thereof.

6. The light emitting diode of claim 5, wherein the clay comprises pyrophyllite-talc, montmorillonite, fluorine hectorite, kaolinite, vermiculite, illite, mica, brittle mica, or a combination thereof.

7. The light emitting diode of claim 4, wherein the plate-shaped particle has an aspect ratio of about 1/100,000 to about 1/10.

8. The light emitting diode of claim 4, wherein the plate-shaped particle is included in an amount of about 1 to about 100 parts by weight, based on 100 parts by weight of the epoxy resin or the thiol-ene resin.

9. The light emitting diode of claim 1, wherein the semiconductor nanocrystal is coated with a polymer comprising a carboxyl group or a salt thereof.

10. The light emitting diode of claim 1, wherein the matrix comprises a polymer, an inorganic oxide, or a combination thereof.

11. The light emitting diode of claim 1, wherein the matrix is a composite comprising the semiconductor nanocrystal or a mixture comprising the semiconductor nanocrystal.

12. The light emitting diode of claim 10, wherein the polymer is a silicone resin; a polysiloxane resin; an epoxy resin; a poly(methyl(meth)acrylate) resin; a polymer of a first monomer comprising at least one thiol group at a terminal end and a siloxane second monomer or oligomer comprising at least one carbon-carbon unsaturated bond; a polymer of a first monomer comprising at least one thiol group at a terminal end and a second monomer including at least one carbon-carbon unsaturated bond at a terminal end, or a combination thereof.

13. A method of manufacturing a case, the method comprising:
disposing a matrix comprising a semiconductor nanocrystal in a case main body; and
providing a sealant by coating a resin composition comprising an epoxy resin, a thiol-ene resin, or a combination thereof, and a curing agent, on the case main body; and
curing the resin composition at a temperature ranging from about 0° C. to about 200° C. to manufacture the case,
wherein the sealant has gas permeability of about 1 cubic centimeter at standard temperature and pressure per centimeter per meter squared per day per atmosphere or less and tensile strength of about 5 megaPascals or more, and
wherein the semiconductor nanocrystal is a Group II-VI compound, a Group III-V compound, a Group IV-VI compound, a Group IV element, a Group IV element, a Group IV compound, or a combination thereof, and
wherein the sealant comprises an epoxy resin and a plate-shaped particle, or a thiol-ene resin.

14. The method of claim 13, wherein the sealant has a tensile modulus of more than about 0.7 gigaPascals.

15. The method of claim 13, wherein
the epoxy resin is a polymerization product of a polyhydric phenol or a polyhydric alcohol, and an epihalohydrin, and
the thiol-ene resin is a polymer of a first monomer comprising at least one thiol group at a terminal end and a second monomer comprising at least one carbon-carbon unsaturated bond at a terminal end.

16. The method of claim 13, wherein the plate-shaped particle comprises an inorganic oxide, a carbon-containing material, a metal-containing material, or a combination thereof.

17. The method of claim 13, wherein the semiconductor nanocrystal is coated with a polymer comprising a carboxyl group or a salt thereof.

18. The method of claim 13, wherein the matrix comprises a polymer, an inorganic oxide, or a combination thereof.

19. The method of claim 13, wherein the matrix is a composite comprising the semiconductor nanocrystal or a mixture comprising the semiconductor nanocrystal.

20. The method of claim 18, wherein the polymer is a silicone resin; a polysiloxane resin; an epoxy resin; a poly(methyl(meth)acrylate) resin; a polymer of a first monomer comprising at least one thiol group at a terminal end and a siloxane second monomer or oligomer comprising at least one carbon-carbon unsaturated bond; a polymer of a first monomer comprising at least one thiol group at a terminal end and a second monomer comprising at least one carbon-carbon unsaturated bond at a terminal end; or a combination thereof.

21. The light emitting diode of claim 1, which further comprises a polymer disposed in the recess portion of the substrate.

22. The light emitting diode of claim 1, wherein sealant comprises the epoxy resin.

23. The light emitting diode of claim 1, wherein the sealant comprises the thiol-ene resin.

* * * * *